United States Patent
Park

(10) Patent No.: US 7,888,964 B2
(45) Date of Patent: *Feb. 15, 2011

(54) DEVICE AND METHOD FOR TESTING A RESISTANCE VALUE OF ON-DIE-TERMINATION DEVICE AND SEMICONDUCTOR DEVICE HAVING THE SAME

(75) Inventor: Jung Hoon Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 33 days.

This patent is subject to a terminal disclaimer.

(21) Appl. No.: 12/347,219

(22) Filed: Dec. 31, 2008

(65) Prior Publication Data

US 2009/0267637 A1 Oct. 29, 2009

(30) Foreign Application Priority Data

Apr. 25, 2008 (KR) ...................... 10-2008-0038838

(51) Int. Cl.
*H03K 19/003* (2006.01)

(52) U.S. Cl. .......................................... 326/30; 326/26
(58) Field of Classification Search .................. 326/30, 326/26

See application file for complete search history.

(56) References Cited

U.S. PATENT DOCUMENTS

| | | | | |
|---|---|---|---|---|
| 6,734,702 B1 * | 5/2004 | Ikeoku et al. | ................. | 326/30 |
| 6,924,660 B2 * | 8/2005 | Nguyen et al. | ................. | 326/30 |
| 7,092,480 B1 * | 8/2006 | Younis | ........................ | 377/122 |
| 7,642,808 B2 * | 1/2010 | Jeong et al. | .................... | 326/30 |

FOREIGN PATENT DOCUMENTS

KR 1020070035331 A 3/2007

* cited by examiner

*Primary Examiner*—James Cho
(74) *Attorney, Agent, or Firm*—Ladas & Parry LLP

(57) ABSTRACT

A device and a method for testing a resistance value of an on-die-termination (ODT) device and a semiconductor device having the same are presented. The device can include a comparator, a storage unit and and an output unit. When in an ODT test operation mode, the comparator compares a reference voltage against an input data input to a pad to determine the resistance value of the ODT device and outputs a determination data on the resistance value of the ODT device corresponding to the determination results. The storage unit stores the output of the comparator in synchronization with a clock signal. When in the ODT test operation mode, the output unit outputs the determination data on the resistance value of the ODT device stored in the storage unit to the pad. Thereby not only is the device configured to determine whether or not a defect of the resistance value of the ODT device exists but the device and the method are able to achieve this task in a substantially shorter testing time period.

28 Claims, 6 Drawing Sheets

DEVICE AND METHOD FOR TESTING A RESISTANCE VALUE OF ON-DIE-TERMINATION DEVICE AND SEMICONDUCTOR DEVICE HAVING THE SAME

CROSS-REFERENCE TO RELATED APPLICATIONS

The present application claims priority to Korean patent application number 10-2008-0038838 filed on Apr. 25, 2008, which is incorporated herein by reference in its entirety.

BACKGROUND OF THE INVENTION

The present invention relates generally to a semiconductor device, and more specifically to a device and a method for testing a resistance value of an on-die-termination device applied on a pad with being built in the semiconductor device.

Generally, a double data rate synchronous dynamic random access memory (DDR SDRAM) having an operating frequency above 200 MHz includes an on-die-termination (ODT) device installed on a pad so as to prevent or at least minimize any distortion in signals during transferring the signals.

In a semiconductor device using the ODT device, high speed characteristics may change in accordance to the resistance value of the ODT device.

The resistance value of the ODT device may be changed due to a fluctuations or changes in the power supply voltage, in the operation temperature, in the manufacturing process, and alike. As a result, there is a need to measure the resistance value of the ODT device so as to determine a pass/fail criteria of the measured resistance value.

The resistance value of the ODT device can be measured using a test device before the particular semiconductor device is installed in a system. However, it is particularly difficult to measure the resistance value of the ODT device using the test device after the semiconductor device is installed in a system, such as being installed in a memory module, etc.

Also, even in the case of measuring the resistance value of the ODT device using the test device, a repetitive test should be performed by using the number of pads installed with the ODT device. Accordingly, this repetitive testing protocol is unacceptably time consuming.

SUMMARY OF THE INVENTION

The present invention provides a device and method for testing a resistance value of an on-die-termination (ODT) device capable of providing a test mode for measuring the resistance value of the ODT device and performing a parallel test on all pads installed with the ODT device under the test mode.

The present invention provides a device for testing a value of an on-die-termination resistor when under the test mode which is capable of determining the resistance value of the ODT device by using an input buffer and an output driver installed in a DRAM.

The present invention provides a semiconductor device capable of performing the test mode by using the input buffer and the output driver that share the same pad.

There is provided a device for testing a value of an on-die-termination resistor comprising: a comparator, when in an ODT test mode state, that compares an input data input through a first pad from the outside against an internal reference voltage set to test an ODT device and which outputs a determination data on the resistance value of the ODT device corresponding to the comparison results; and an output unit, when in the ODT test operation, that outputs the determination data on the resistance value of the ODT device to a second pad.

The internal reference voltage may be set to a level lower than a level of the resistance value of the ODT device set as a target value level using the input data.

The device for testing the resistance value of the ODT device may further comprise a storage unit that stores the determination data of the resistance value of the ODT device output from the comparator. Preferably, when in the ODT test operation, the output unit outputs the determination data of the resistance value of the ODT device stored in the storage unit to the second pad.

The storage unit may include a D flip-flop that stores the output of the comparator in synchronization with a clock signal.

The first pad and the second pad may be configured as the same pad.

The comparator may include an input buffer for the first pad.

The output unit may include an output driver for a cell data for the second pad.

There is also provided a device for testing a resistance value of an on-die-termination device comprising: a comparator, when in an ODT test mode state, that compares an input data input through a pad from the outside against an internal reference voltage set to test the resistance value of an ODT device and which then outputs a determination data on the resistance value of the ODT device corresponding to the comparison results; and a storage unit that stores the determination data on the resistance value of the ODT device output from the comparator.

The internal reference voltage may be set to a level lower than a level of the resistance value of the ODT device set as a target using the input data.

The storage unit may include a D flip-flop that stores the output of the comparator in synchronization with a clock signal.

The comparator may include an input buffer for the pad.

There is also provided a device for testing a resistance value of an on-die-termination device comprising: a comparator, a storage unit and an output unit. When the comparator is in a normal mode state, the comparator performs an input buffer operation for an input data input through a pad. When the comparator is in an ODT test mode state, the comparator compares an input data input through the pad against an internal reference voltage set to test the resistance value of an ODT device. The comparator outputs a determination data on the resistance value of the ODT device corresponding to the comparison results. The storage unit stores an output of the comparator. When the output unit is in the normal mode state, the output unit drives a cell data output to the pad. When the output unit is in the ODT test mode state, the output unit outputs the determination data on the resistance value of the ODT device stored in the storage unit.

The internal reference voltage may be set at a level lower than a level of the value resistance value of the ODT device set as a target using the input data.

The comparator may include a voltage selector. When the voltage selector is in the normal mode, the voltage selector selects and outputs the reference voltage. When the voltage selector is in the ODT test mode, the voltage selector selects and outputs the internal reference voltage. The comparator may also include an input buffer that compares the input data input to the pad against the selected voltage and which subsequently outputs the compared input data as the determination data on the resistance value of the ODT device.

The storage unit may include a D flip-flop that stores the output of the comparator in synchronization with a clock signal.

The output unit may include a drive controller, an output driver, and an ODT driver. When the drive controller is in the ODT test operation mode, the drive controller selects and outputs the determination data on the resistance value of the ODT device of the storage unit. When the drive controller is in the normal mode, the drive controller selects and outputs the cell data. The output driver drives the output of the drive controller. The ODT driver is enabled when the input data is input to the pad to reflect the resistance value of the ODT device to the input data and is disabled when the resistance value of the ODT device is output to the pad to remove the value of the ODT resistor.

The drive controller may include an enable unit, an output selector and a drive signal output unit. The enable unit of the drive controller when in the ODT test operation mode provides an ODT output enable signal controlling the output of the determination data on the resistance value of the ODT device. The enable unit of the drive controller when in the normal mode provides an enable signal corresponding to the normal mode. When enabled in the ODT test operation mode, the output selector of the drive controller selects and outputs any one of the cell data and the determination data on the resistance value of the ODT device by the ODT test mode signal. The drive signal output unit of the drive controller transfers a signal output from the output selector to the output driver in accordance to the signal state provided from the enable unit.

There is also provided a device for testing a resistance value of an on-die-termination device comprising: a comparator and a storage unit. The comparator when in an ODT test mode performs an input buffer operation on an input data input through a pad in a normal mode state, compares an input data input through the pad and an internal reference voltage set to test the resistance value of an ODT device state, and which subsequently outputs a determination data on the resistance value of the ODT device corresponding to the comparison results. The storage unit stores an output of the comparator.

The internal reference voltage may be set to a level lower than a level of the resistance value of the ODT device set as a target using the input data.

The comparator may include a voltage selector and an input buffer. The voltage selector of the comparator, when in the normal mode, selects and outputs a reference voltage. The voltage selector of the comparator, when in the ODT test mode, selects and outputs the internal reference voltage by using the ODT test mode signal. The input buffer of the comparator compares the input data input to the pad against the voltage selected and output in the voltage selector and which subsequently outputs the compared input data as the determination data on the resistance value of the ODT device.

The storage unit may include a D flip-flop that stores the output of the comparator in synchronization with a clock signal.

There is also provided a semiconductor device comprising: a pad; a comparison voltage supply unit; an input buffer; a storage unit; and an output driver. The ODT device is applied to the pad of the semiconductor device. The comparison voltage supply unit of the semiconductor device provides any one of a first voltage corresponding to a normal mode and a second voltage corresponding to a test mode for testing a resistance value of the ODT device as the comparison voltage. The input buffer of the semiconductor device compares and outputs an input data of the pad as the comparison voltage provided from the comparison voltage supply unit. The storage unit of the semiconductor device stores the comparison results of the input buffer. The output data selection unit of the semiconductor device outputs the cell data corresponding to the normal mode and outputs the data stored in the storage unit corresponding to the test mode. The output driver of the semiconductor device outputs data provided from the selection unit.

The comparison voltage supply unit may supply, as a second voltage, a voltage with a lower level than a level of the resistance value of the ODT device set as a target using the input data.

The comparison voltage supply unit may include an internal voltage generator; a mode controller and a voltage selector. The internal voltage generator of the comparison voltage supply unit provides a first voltage corresponding to a normal mode and a second voltage corresponding to the test mode for testing the resistance value of the ODT device. The mode controller of the comparison voltage supply unit provides the ODT test mode signal enabled in the test operation mode. The voltage selector of the comparison voltage supply unit selects any one of the first voltage and the second voltage using the ODT test mode signal of the mode controller and outputs the selected voltage to the input buffer.

The storage unit may include a D flip-flop that stores the output of the comparator in synchronization with a clock signal.

The output data selection unit may include an enable unit; a mode controller; and a data selector. The enable unit of the output data selection unit provides an ODT output enable signal enabled in the ODT test operation mode and provides an enable signal corresponding in the normal mode to the output driver. The mode controller of the output data selection unit provides an ODT test mode signal enabled in the test operation mode. The data selector of the output data selection unit receives the cell data and the data stored in the storage unit and selects any one of the cell data and the data stored in the storage unit using the ODT test mode signal of the mode controller and outputs the selected data to the output driver.

There is provided a semiconductor device according to the present invention comprising: a pad; a comparison voltage supply unit; an input buffer to which an ODT device is applied; a comparison voltage supply unit; and a storage unit. The pad of the semiconductor device provides any one of a first voltage corresponding to a normal mode and a second voltage corresponding to a test mode for testing a resistance value of the ODT device as the comparison voltage. The input buffer of the semiconductor device compares and outputs an input data of the pad as the comparison voltage provided from the comparison voltage supply unit. The storage unit of the semiconductor device stores the comparison results of the input buffer.

The comparison voltage supply unit may supply, as a second voltage, a voltage with a lower level than a level of the resistance value of the ODT device set as a target by the input data.

The comparison voltage supply unit may include an internal voltage generator; a mode controller; and a voltage selector. The internal voltage generator of the comparison voltage supply unit provides the first voltage corresponding to the normal mode and the second voltage corresponding to the test mode for testing the resistance value of the ODT device. The mode controller of the comparison voltage supply unit provides the ODT test mode signal enabled in the test operation mode. The voltage selector of the comparison voltage supply unit selects any one of the first voltage and the second voltage by using the ODT test mode signal of the mode controller and which subsequently outputs the selected voltage to the input buffer.

The storage unit may include a D flip-flop that stores the output of the comparator in synchronization with a clock signal.

A method for testing a resistance value of an on-die-termination device comprises the steps of generating, storing, and outputting. The generating step generates a comparison data by comparing a test data input to a pad against a reference voltage in an ODT test operation. The storing step stores the comparison data in synchronization with a clock signal. The outputting step outputs the comparison data to the pad by driving the comparison data when an output enable signal is enabled.

The reference voltage may be set to a level lower than a level of the resistance value of the ODT device set as a target by using the test data.

The method for testing the resistance value of the on-die-termination device may further comprise the step of reflecting. The reflecting step reflects the resistance value of the ODT device to the test data enabled when the test data are input through the pad and removes the resistance value of the ODT device disabled when the comparison data are output through the pad.

The outputting step of the method for testing a value of an on-die termination resistor that outputs the comparison data to the pad by driving the comparison data may comprise an enabling step, selecting step, a second outputting step, and a third outputting step. The enable step comprises enabling the output enable signal by using the ODT output enable signal when enabled in the ODT test operation. The selecting step comprises selecting the comparison data by the ODT test mode signal when enabled in the ODT test operation. The second outputting step comprises outputting the drive signal by inverting and driving the comparison data when the output enable signal is enabled. The third outputting step comprises outputting the comparison data to the pad by driving the comparison data by using the drive signal.

The present invention provides a device for testing a ODT device that compares the resistance value of the ODT device with the voltage corresponding to the targeted resistance value of the ODT device through the input buffer and outputs the results through the output driver. Thereby the device of the present invention makes it possible to more easily test of the resistance value of the ODT device.

Also, the present invention provides a device and a method for simultaneously testing each pad applied with the ODT through the test device, thereby making it possible to reduce the testing time.

DESCRIPTION OF SPECIFIC EMBODIMENTS

The present invention provides a specific mode for testing a resistance value of an ODT device. That is, the present invention provides a test mode to a semiconductor device. Under the test mode, when a data for a test is input to a pad installed with the ODT device from the outside, the semiconductor device compares the data against internal generation voltage and outputs the comparison results to the outside. A configuration where the comparison results during the comparison and output processes are stored may be provided.

Figure 1:
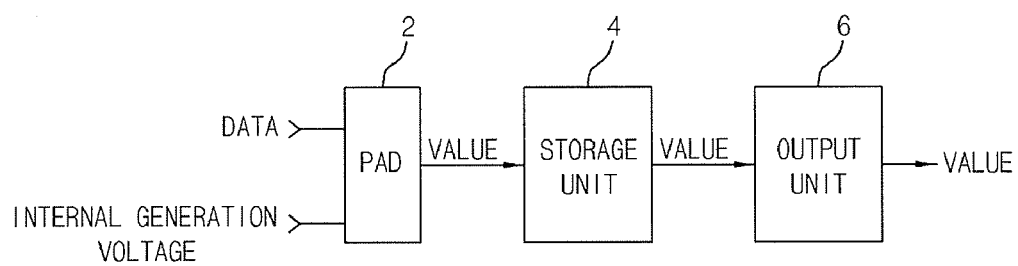
FIG. 1 is a block configuration diagram showing a device for testing a resistance value of an on-die-termination device according to an embodiment of the present invention.

A functional block diagram of an embodiment according to the present invention may be proposed as in FIG. 1. The device for testing the resistance value of the ODT device may include a comparator 2, a storage unit 4, and an output unit 6.

A comparator 2 receives the data input from the pad installed with the ODT device and receives the internal generation voltage. The comparator 2 then outputs the comparison results of the data and the internal generation voltage. That is, the comparison results in detecting the voltage difference therebetween, so as to test the resistance value of the ODT device. The comparison results of the comparator 2 are defined by "VALUE" in FIG. 1 and the internal generation voltage may be provided as voltage having a specific level established from an internal voltage generator (not shown) so as to test the resistance value of the ODT device.

An output "VALUE" of the comparator 2 may be stored in a storage unit 4 and a test result "VALUE" stored in the storage unit 4 is output through an output unit 6.

At this time, the output unit 6 may be configured to output the test result "VALUE" to the pad receiving the data or other pads.

The comparator 2 and the output unit 6 may be optionally configured to use an input buffer and an output driver in which each may be configured to input and output general data.

As shown in FIGS. 2 to 5 one embodiment of the present invention may be configured. The embodiment of FIGS. 2 to 5 may also be applied to a configuration where the input buffer and the output driver share the pad.

Figure 2:
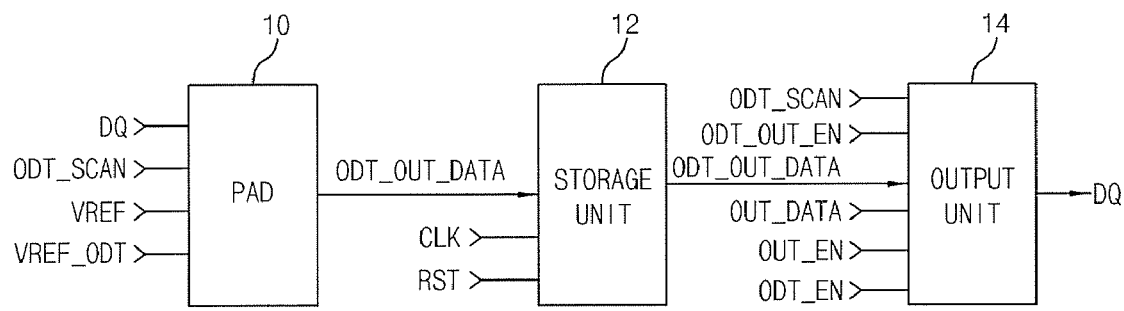
FIG. 2 is a block configuration diagram showing a configuration using an input buffer and an output driver of a device for testing a resistance value of an on-die-termination device according to the present invention.

Referring to FIG. 2, the present invention defines a test mode for testing the resistance value of the ODT device and provides scan signals for performing the test mode.

In the state where the scan signal is enabled, that is, the test mode is activated (hereinafter, referred to as an ODT test mode), the signal input through the pad from the outside and the voltage corresponded to the target resistance value of the ODT device set as a target in designing are compared. The comparison results are used to determine a pass/fail diagnosis of the resistance value of the ODT device.

A device for testing the resistance value of the ODT device of FIG. 2 comprises a comparator 10, a storage unit 12, and an output unit 14. The comparator 10 may optionally use an input buffer for a pad installed with the ODT device and the output unit 14 may optionally use an output driver sharing the pad with the comparator 10.

Specifically, the comparator 10 is configured to perform a normal mode operation by performing a buffer function when in the normal input data. The comparator 10 is also configured to perform testing the resistance value of the ODT device when in a test mode operation. In the case of the normal mode operation, the comparator 10 compares data input through a pad DQ from the outside with reference voltage VREF. In the case of the test mode, the comparator 10 compares test input data through the pad DQ against the outside with ODT reference voltage VREF_ODT provided to test the resistance value of the ODT device. The comparator 10 outputs the comparison result as a comparison data ODT_OUT_DATA.

The storage unit 12 stores the comparison data ODT_OUT_DATA in synchronization with a clock signal CLK in accordance to a state of a reset signal RST. The reset signal RST may be designed to be linked in accordance to the test mode. In the case of the normal mode, the output of the comparator cannot be stored by using the reset signal RST. In the case of the test mode, the output of the comparator 10 can be stored and activated by using the reset signal RST.

The output unit 14 performs the normal mode operation by driving a cell data provided for a normal output. The output unit 14 performs the test mode operation by outputting the comparison data ODT_OUT_DATA provided from the storage unit 12. The output unit 14 selects one of the normal cell data OUT_DATA or the comparison data ODT_OUT_DATA stored in the storage unit 12 in accordance to the operation mode and which subsequently outputs the selected data to the pad DQ.

The paticular operation mode is selected by using the scan signal enabled in the ODT test operation mode, that is, the ODT test mode signal ODT_SCAN. Wherein the ODT test mode signal ODT_SCAN may be generated to be synchronized with an external instruction or to be maintained in an activation state during a given amount of time to be tested by using a method of combining the test signals, etc. In other words, when the ODT test mode signal ODT_SCAN is enabled, the operation mode becomes the ODT test operation mode and when the ODT test mode signal ODT_SCAN is disabled, the operation mode becomes the normal operation mode.

The cell data OUT_DATA is read from a memory cell by using a read instruction when in the normal operation mode and the data is outputted to the pad DQ when a cell data output enable signal OUT_EN is enabled.

Also, the comparison data ODT_OU_DATA is outputted from the storage unit 12 to the pad DQ when the ODT output enable signal ODT_OUT_EN is enabled when in the ODT test operation mode.

Also, the ODT drive enable signal ODT_EN is a signal which is enabled when the data is received from the pad DQ and is disabled when the data is transmitted to the pad DQ.

Figure 3:
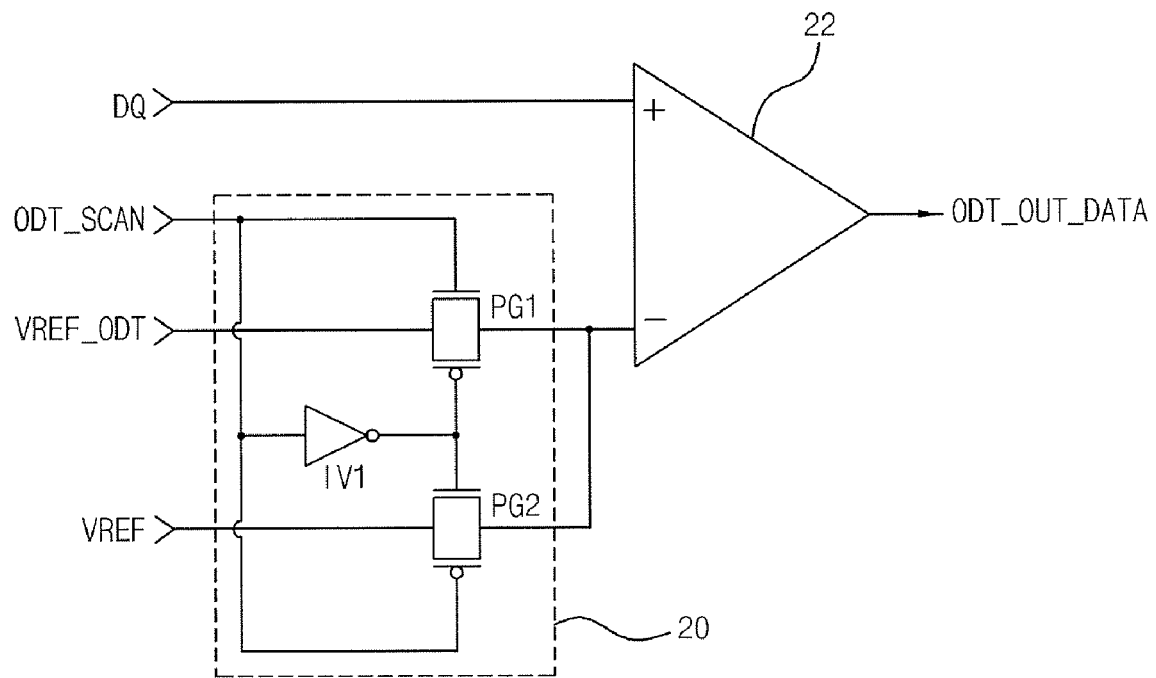
FIG. 3 is a detailed block configuration diagram of the comparator of FIG. 2.

Referring to FIG. 3, the comparator 10 may be configured to include a voltage selector 20 and an input buffer 22. The comparator 10 is operated as the input buffer for the data input from the outside when the ODT test mode signal ODT_SCAN is disabled. The comparator 10 performs the comparison operation for the test mode when the ODT test mode signal ODT_SCAN is enabled.

Regarding the operation of the comparator 10 for each of the operational modes as described above, the voltage selector 20 of the the comparator 10 may include pass gates PG1, PG2 and an inverter IV1. Pass gate PG1 selects and outputs an ODT reference voltage VREF_ODT, which is generated and applied inside a DRAM in the ODT test operation mode when the ODT test mode signal ODT_SCAN is enabled. Pass gate PG2 selects and outputs the reference voltage VREF applied from the outside of the DRAM in the normal operation mode when the ODT test mode signal ODT_SCAN is disabled. The inverter IV1 inverts the ODT test mode signal ODT_SCAN and provides the inverted signal to the pass gates PG1, PG2.

The reference voltage VREF is a voltage used to determine a logic level of the data input through the pad DQ when in the normal operation mode.

Preferably when in the ODT test operation mode, the ODT reference voltage VREF_ODT is set to be lower than a voltage level of a low data input to the pad DQ from the outside corresponding to the target resistance value of the ODT device in designing.

The voltage level of the low data is inputted to the pad DQ when in the ODT test operation mode varies in accordance to the target value of the ODT resistor and in accordance to the drive resistance value of the output driver. Say for instance using the following illustrative example where the voltage supplied to the DRAM is 2.0V, the target resistance value is 50Ω, the drive resistance value of the output driver is 20Ω, the low data input to the pad DQ has a voltage level of about 0.57V(2.0V*{20Ω/(50Ω+20Ω)}≈0.54V). In this illustrative example, the ODT reference voltage VREF_ODT should be set to a voltage level lower than 0.57V.

The input buffer 22 receives data input at a non-inverting terminal (+) from the pad DQ and receives the particular voltage signal selected by the voltage selector 20 at the inverting terminal (−). The input buffer 22 thereby compares the voltage therebetween and subsequently outputs the comparison data as ODT_OUT_DATA.

As a result when the comparator 10 is in the normal operation mode, the comparator 10 functions as an input buffer that compares the data input to the pad DQ against the reference voltage VREF and subsequently determines and outputs the corresponding logic level of the data. On the other hand, when the comparator 10 is in the ODT test operation mode, the comparator 10 functions as a comparator that compares the low data input from the pad DQ against the supplied ODT reference voltage VREF_ODT that reflects the target resistance value of the ODT device so that the comparator 10 subsequently determines and outputs information corresponding to the actual resistance value of the ODT device for diagnosis of whether or not a defect in the resistance exists.

In other words, as described above, since the ODT reference voltage VREF_ODT is set to be lower than the voltage level of the low data corresponding to the target resistance value of the ODT device in designing, and when the actual resistance value of the ODT device is within the tolerance of the target resistance value of the ODT device, then the data voltage is higher than the ODT reference voltage VREF_ODT. Therefore, the comparison data ODT_OUT_DATA is output at a high level, which corresponds to the fact that there is no defect in the resistance because ODT_OUT_DATA is within QA/QC limits. To the contrary, when the actual resistance value of the ODT device is larger than the target resistance value of the ODT device, then data voltage is lower than the ODT reference voltage VREF_ODT and as a result the comparison data ODT_OUT_DATA is output at a low level which corresponds to the fact that that there is a defect in the resistance because the ODT_OUT_DATA is outside of QA/QC limits. Therefore, defect conditions of the actual resistance value of the ODT device can be determined and diagnosed.

Figure 4:
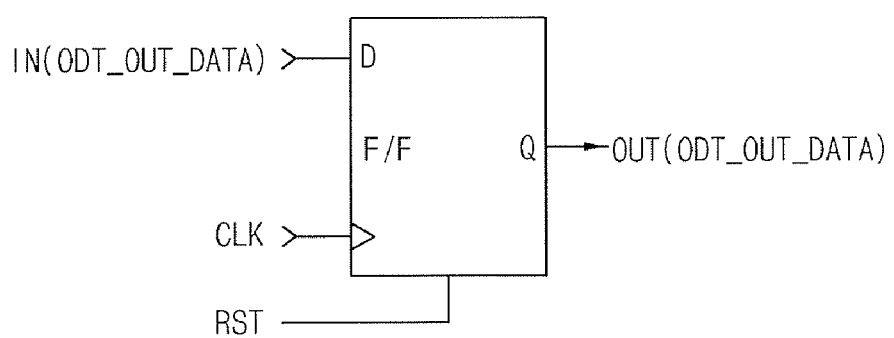
FIG. 4 is a detailed block configuration diagram of the storage unit of FIG. 2.

The storage unit 12 can be configured as a D flip-flop that stores the input signal IN output from the comparator 10 in synchronization with the clock signal CLK, that is, the comparison data ODT_OUT_DATA as shown in FIG. 4. The storage unit 12 can also be configured to output the stored comparison data as an output signal in synchronization with the clock. Preferably, the D flip-flop can be configured to reset by using the reset signal RST.

Figure 5:
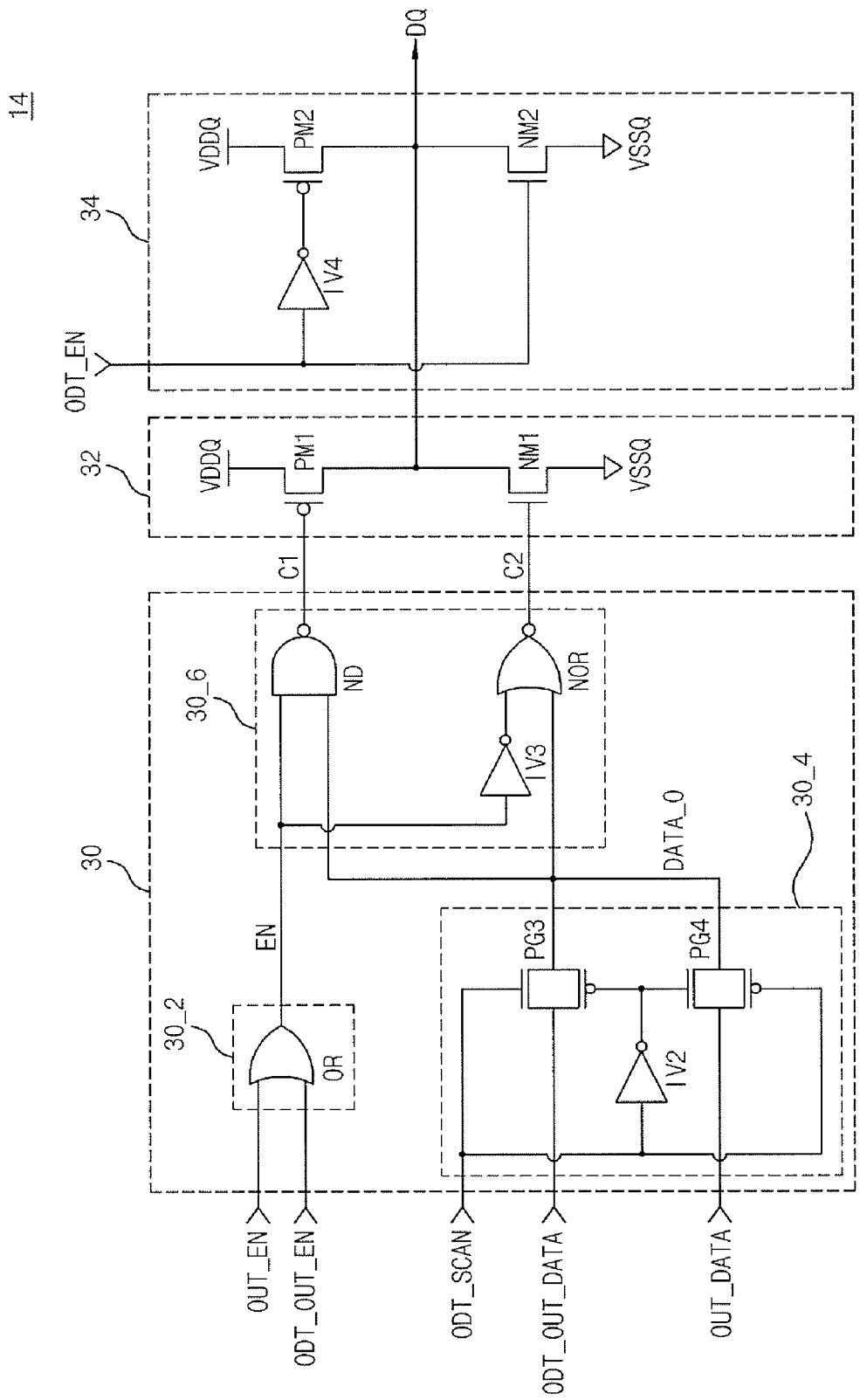
FIG. 5 is a detailed block configuration diagram of the output unit of FIG. 2

Referring to FIG. 5, the output unit 14 may be configured to include a drive controller 30, an output driver 32, and an ODT driver 34.

As shown in FIG. 5, when the ODT test mode signal ODT_SCAN is disabled, the output unit 14 operates as the output driver that drives the data output by using the read command. When the ODT test mode signal ODT_SCAN is enabled the output unit 14 operates as the output circuit that outputs the comparison data stored in the storage unit 12.

As shown in FIG. 5, the drive controller 30 can be configured to select any one of the cell data OUT_DATA and the comparison data ODT_OUT_DATA in accordance to the particular operation mode and to subsequently output the selected data as the driving signal. The output driver 32 can be configured to output the selected signal in the drive controller 30 to the pad DQ.

Specifically, the drive controller 30 can include an enable unit 30_2, an output selector 30_4, and a drive signal output unit 30_6.

The enable unit 30_2 of the drive controller 30 may be configured as an OR gate OR. This OR gate of the enable unit 30_2 OR receives the cell data output enable signal OUT_EN enabled to output the cell data OUT_DATA when in the normal operation mode. This OR gate of the enable unit 30_2 also OR receives the ODT output enable signal ODT_OUT_EN enabled to output the comparison data ODT_OUT_DATA when in the ODT test operation mode. The OR gate of the enable unit 30_2 then outputs the output enable signal EN enabled when at least one of the received signals is enabled.

The output selector 30_4 may be implemented as including pass gates PG3, PG4 and an inverter IV2. The pass gate PG3 determines the pass/fail of the value resistance of the ODT device when in the ODT test operation mode where the ODT test mode signal ODT_SCAN is enabled to select and output the stored comparison data ODT_OUT DATA. The pass gate PG4 selects and outputs the cell data OUT_DATA read from the memory cell when in the normal operation mode where the ODT test mode signal ODT_SCAN is disabled. The inverter IV2 inverts the ODT test mode signal ODT_SCAN and supplies the inverted signal to the pass gates PG3, PG4.

The drive signal output unit 30_6 may be implemented by including a NAND gate ND, a NOR gate NOR, and an inverter IV3. The NAND gate ND is shown receiving the output enable signal EN output from the enable unit 30_2 and shown receiving the data output DATA_0 from the output selector 30_4 (one of ODT_OUT_DATA and OUT_DATA selected in accordance to the operation mode) to output a drive signal C1. The NOR gate NOR of the drive signal output unit 30_6 is shown receiving the output enable signal EN output from the enable unit 30_2 inverted by the inverter IV3 and shown receiving the data output DATA_0 from the output selector 30_4 (one of ODT_OUT_DATA and OUT_DATA selected according to the operation mode) to output a drive signal C2. In other words, when the output enable signal EN is enabled, the drive signals C1, C2 are signals correspond to the inverted data which is selected and provided by the output selector 30_4 so that the drive signals C1, C2 have the same logic level.

The output driver 32 can be implemented to include a PMOS transistor PM1 and an NMOS transistor NM1. The PMOS transistor PM1 of the output driver 32 is shown connected between a power supply voltage terminal VDDQ and an output terminal connected to pad DQ. The PMOS transistor PM1 of the output driver 32 pull-up drives the output terminal by having the drive signal C1 applied to the gate of the PMOS transistor PM1 of the output driver 32. The NMOS transistor NM1 of the output driver 32 is shown connected between the output terminal and the ground voltage terminal VSSQ. The NMOS transistor NM1 of the output driver 32 pull-down drives the output terminal by the drive signal C2 applied to the gate of the NMOS transistor NM1 of the output driver 32. The output terminal of the output driver 32 is connected to the pad DQ which is a common drain terminal of the PMOS transistor PM1 and the NMOS transistor NM1 of the output driver 32.

The ODT driver 34 can be implemented to include the PMOS transistor PM2, the NMOS transistor NM2, and the inverter IV4. The PMOS transistor PM2 of the ODT driver 34 is shown connected between the power voltage terminal VDDQ and the output terminal. The PMOS transistor PM2 of the ODT driver 34 controls the pull-up resistance of the output terminal using the inverted the ODT drive enable signal OUT_EN applied to the gate of the PMOS transistor PM2 of the ODT driver 34. The NMOS transistor NM2 of the ODT driver 34 is shown between the output terminal and the ground voltage terminal VSSQ. The NMOS transistor NM2 of the ODT driver 34 controls the pull-down resistance of the output terminal by using the ODT drive signal OUT_EN applied to the gate of the NMOS transistor NM2 of the ODT driver 34. Herein, the inverter IV4 of the ODT driver 34 inverts the ODT drive enable signal OUT_EN. The output terminal of the ODT driver 34 is a common drain terminal of the PMOS transistor PM2 and the NMOS transistor NM2 and is shown connected to the pad DQ.

In other words, the output unit 14 outputs the cell data OUT_DATA to the pad DQ when in the normal operation mode. On the other hand, the output unit 14 outputs the comparison data ODT_OUT_DATA determining the pass/fail of the value resistance of the ODT device value to the pad DQ when in the ODT test operation mode.

Figure 6:
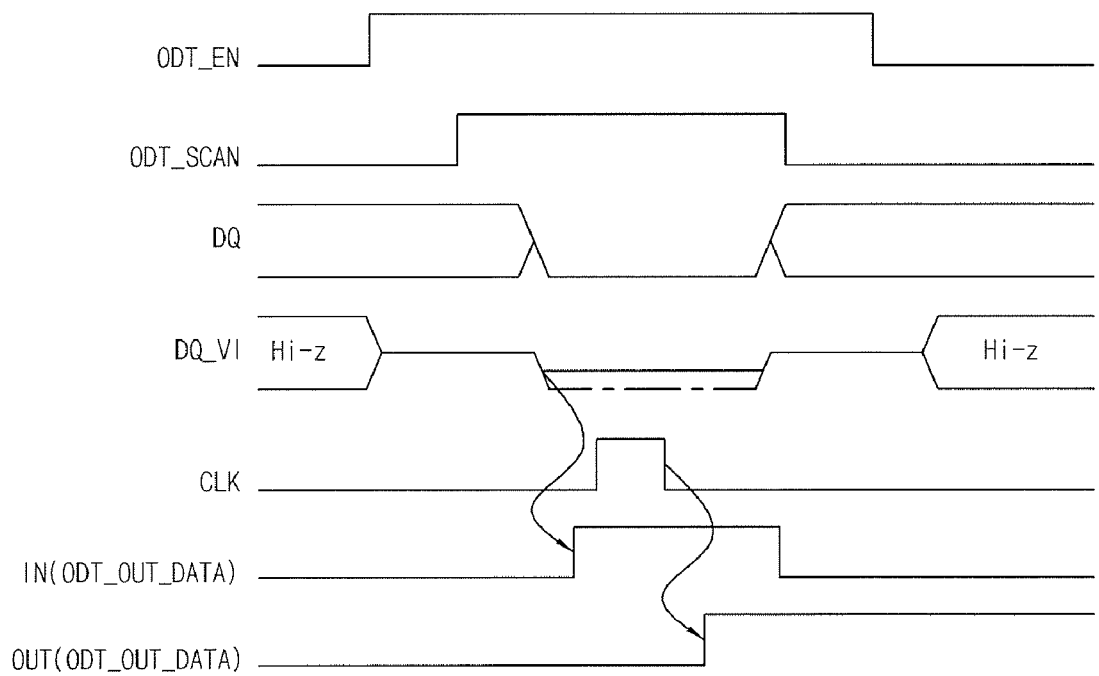
FIGS. 6 and 7 are diagrams of operation waveforms appearing when the resistance value of the on-die-termination device according to the present invention is performed.
Figure 7:
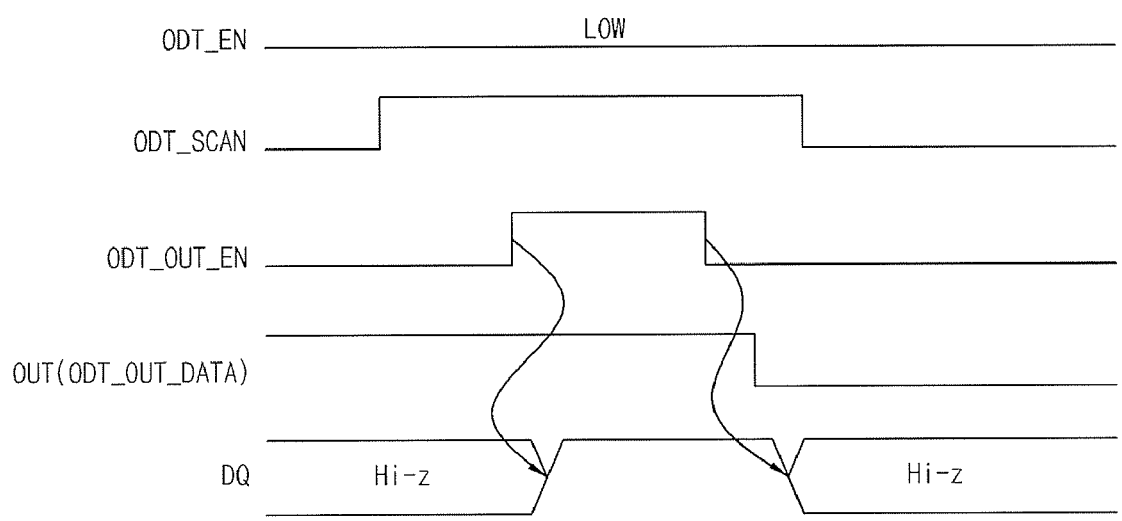

A method for performing the ODT test using the ODT test device of the present invention will be described with reference to the operation waveform diagrams of the ODT test of FIGS. 6 and 7.

The normal operation mode is a general operation, such as a read and write of the DRAM, etc. and thus, the description of this normal operation process thereof will be omitted.

First, the comparison data ODT_OUT_DATA is generated by comparing the data input to the pad with the ODT reference voltage VREF_ODT.

Specifically, the ODT drive enable signal ODT_EN driving the ODT driver is enabled in order to measure the value of the ODT resistor of the pad DQ installed with the ODT. Then, when the ODT test mode signal ODT_SCAN is enabled, the low data is input through the pad DQ from the outside of the DRAM. At this time, the data voltage DQ_VI input to the inside of the DRAM has a predetermined voltage level that corresponds, i.e., reflects, the value of the ODT resistor. The input buffer then compares the data voltage DQ_VI with the ODT reference voltage VREF_ODT to output the comparison data ODT_OUT_DATA.

As described above, since the ODT reference voltage VREF_ODT is set to a voltage level lower than the voltage level of the data voltage DQ_VI corresponding to the target resistance value of ODT device, when the actual resistance value of the ODT device approximately has a value within a QA/QC tolerance of the target resistance value of the ODT device, then the data voltage DQ_VI is higher than the ODT reference voltage VREF_ODT. In this case, the comparison data ODT_OUT_DATA is output at a high level. On the other hand, when the actual resistance value of the ODT device has a value larger than the target resistance value of the ODT device, then the data voltage DQ_VI becomes lower than the ODT reference voltage VREF_ODT, such that the comparison data ODT_OUT_DATA is output at a low level.

Next, the storage unit 12 stores the comparison data ODT_OUT_DATA in synchronization the clock signal CLK.

Then, when the comparison data is synchronized with the ODT output enable signal ODT_OUT_EN, the output unit 14 outputs the comparison data ODT_OUT_DATA to the pad DQ.

Specifically, in order to prevent the distortion of the comparison data ODT_OUT_DATA output to the pad DQ installed with the ODT, the ODT drive enable signal ODT_EN driving the ODT driver is disabled. Then when the ODT test mode signal ODT_SCAN is enabled, the ODT output enable signal ODT_OUT_EN is enabled, so that the comparison data ODT_OUT_DATA is output to the pad DQ.

Figure 8:
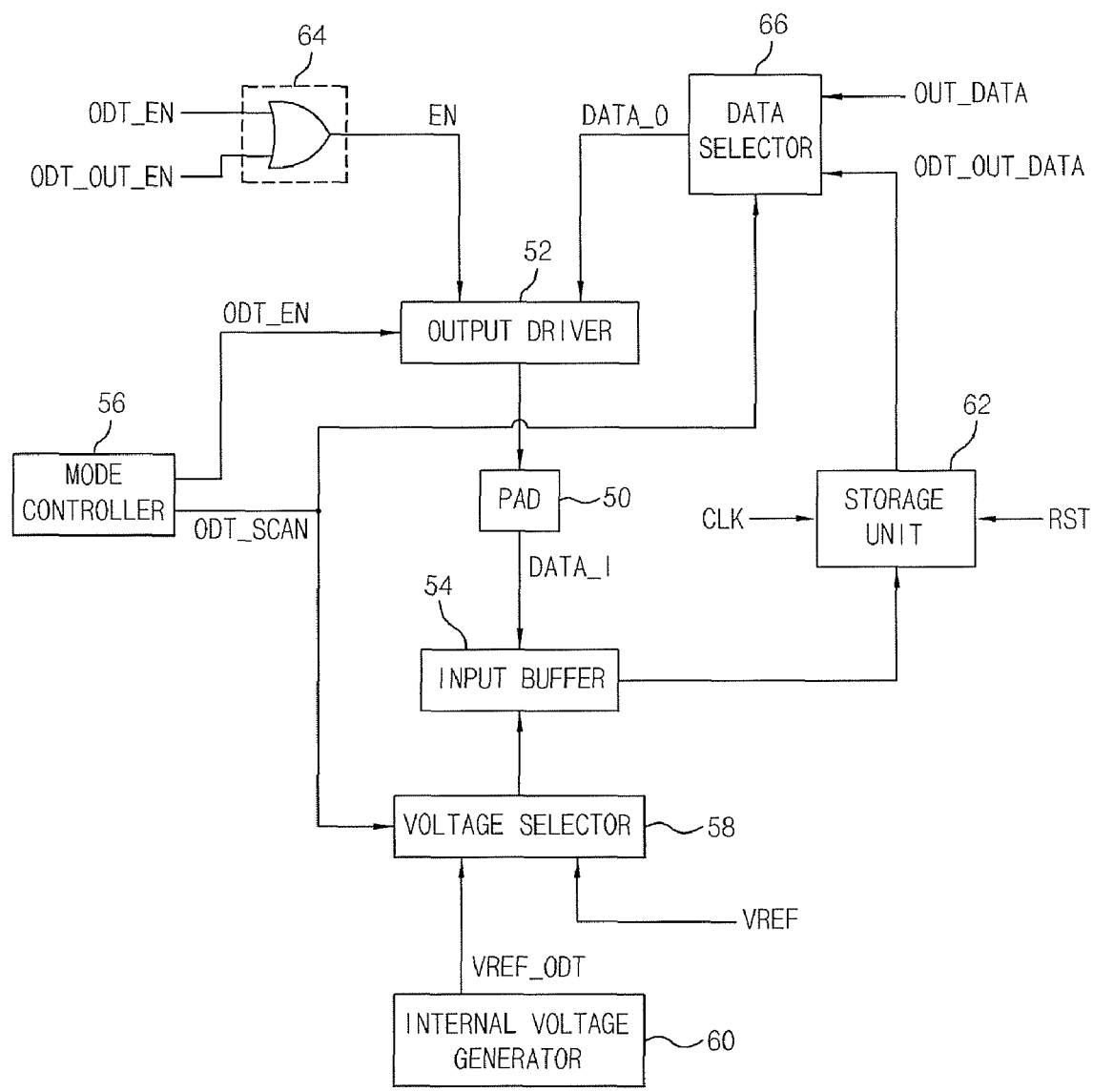
FIG. 8 is a block configuration diagram showing another embodiment of the resistance value of the on-die-termination device according to the present invention.

Meanwhile, an embodiment using the output driver and the input buffer sharing the DQ may be proposed as in FIG. 8.

In FIG. 8 the output driver 52 and the input buffer 54 shares the pad 50 and the mode controller 56 provides the ODT test mode signal ODT_SCAN for testing the resistance value of the ODT device and the ODT enable signal for outputting the ODT test result.

The output driver 52 has a configuration corresponding to the drive signal output unit 30_6, the output driver 32, and the ODT driver 34 of FIG. 5. The input buffer 54 has a configuration corresponding to the input buffer 22 of FIG. 3.

The input buffer 54 compares the data DATA_I for testing the ODT input from the pad 50 DQ with the voltage provided from the voltage selector 58 and provides the comparison result to the storage unit 62. The voltage to be compared against the data DATA_I for testing the ODT device is provided from the voltage selector 58. The voltage selector 58 selects any one of the reference voltage VREF for buffering the general data input and the ODT reference voltage VREF_ODT for testing the resistance value of the ODT device in accordance to the state of the ODT test mode signal ODT_SCAN provided from the mode controller 56 and provides the selected voltage to the input buffer 54. The voltage selector 58 can have a configuration corresponding to the voltage selector 20 of FIG. 2.

The internal voltage generator 60 provides the ODT reference VREF_ODT for testing the value resistance of the ODT device to the voltage selector 58 and the ODT reference voltage VREF_ODT may be set to have the level as described in FIG. 2.

On the other hand, the storage unit 62 stores the comparison result provided from the input buffer 54. The storage unit 62 may be configured of the D flip-flop as in FIG. 4. The storage unit 62 stores and outputs the information in synchronization with the clock signal according to the state of the reset signal RST.

The output driver 52 outputs the data DATA_O provided from the data selector 66 to the pad 50. The enable state of the output driver 52 is determined by the enable signal EN provided from the enable signal buffer 64. The enable signal buffer 64 may be configured as an OR gate. When in the normal operation mode the OR gate of the enable signal buffer 64 transfers the cell data output enable signal OUT_EN to the output driver 52. When in the ODT test operation mode the OR gate of the enable signal buffer 64 transfers the ODT output enable signal ODT_OUT_EN to the output driver 52.

The output driver 52 receives the ODT drive enable signal ODT_EN from the mode controller 56 to enable the ODT driver (corresponding to 34 of FIG. 5) included therein.

The data selector 66 selects the general cell data OUT_DATA or selects the comparison data ODT_OUT_DATA output from the storage unit 62 as the output data DATA_O in accordance to the state of the ODT test mode signal ODT_SCAN provided from the mode controller 56 and subsequently outputs the selected data to the output driver 52. The data selector 66 can have a configuration corresponding to the output selector 30_4 of FIG. 5.

The embodiment using the output driver and the input buffer sharing the DQ may be configured as in FIG. 8 and thus, the ODT resistance test according to the present invention can be performed.

As above, the present invention performs the ODT test, makes it possible to determine whether or not a defect exists in the resistance value of the ODT device of the pad. The ODT test makes it possible to confirm the result through the pad. The ODT test makes it possible to simply test the resistance value of the ODT device. The ODT test also makes it possible to simultaneously test the plurality of pads installed with the ODT device, which thereby making it possible to substantially shorten the requisite testing time.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A device for testing a resistance value of an on-die-termination (ODT) device, the device comprising:
    a comparator, in an ODT test mode state, that compares an input data input through a first pad with reference voltage and outputs a determination data corresponding to the resistance value of the ODT device; and
    an output unit that outputs the determination data to a second pad in the ODT test operation,
    wherein the ODT device is turned on in the ODT test mode.

2. The device according as set forth in claim 1, wherein the reference voltage is set to a level lower than a target voltage level which is determined by the resistance value of the ODT device.

3. The device according as set forth in claim 1, further comprising a storage unit that stores the determination data, wherein the output unit outputs the determination data stored in the storage unit to the second pad in the ODT test mode state.

4. The device according as set forth in claim 3, wherein the storage unit includes a D flip-flop that stores the determination data in synchronization with a clock signal.

5. The device according as set forth in claim 1, wherein the first pad and the second pad are configured to be the same pad.

6. The device according as set forth in claim 1, wherein the comparator includes an input buffer for the first pad.

7. The device according as set forth in claim 1, wherein the output unit includes an output driver for a cell data for the second pad.

8. A device for testing a resistance value of an on-die-termination (ODT) device, the device comprising:
    a comparator, in an ODT test mode state, which compares an input data input through a pad with reference voltage and which outputs a determination data corresponding to the resistance value of the ODT device; and
    a storage unit that stores the determination data output from the comparator.

9. The device according as set forth in claim 8, wherein the reference voltage is set to a level lower than a target voltage level which is determined by the resistance value of the ODT device.

10. The device according as set forth in claim 8, wherein the storage unit includes a D flip-flop that stores the output of the comparator in synchronization with a clock signal.

11. The device according as set forth in claim 8, wherein the comparator includes an input buffer for the pad.

12. A device for testing a resistance value of an on-die-termination (ODT) device, the device comprising:
   a comparator which performs an input buffer operation on an input data input through a pad in a normal mode state, which compares an input data input through the pad with a reference voltage set to test the resistance value of the ODT device in an ODT test mode state, and which outputs a determination data corresponding to the resistance value of the ODT device in an ODT test mode state; and
   a storage unit which stores an output of the comparator.

13. The device as set forth in claim 12, wherein the reference voltage is set to a level lower than a target voltage level which is determined by the resistance value of the ODT device.

14. The device as set forth in claim 12, wherein the comparator includes:
   a voltage selector which selects an external reference voltage in the normal mode, and which selects the reference voltage in the ODT test mode in response to an ODT test mode signal enabled in the ODT test mode; and
   an input buffer which compares the input data input to the pad with the voltage selected by the voltage selector and outputs the compared input data as the determination data.

15. The device as set forth in claim 12, wherein the storage unit includes a D flip-flop that stores the determination data in synchronization with a clock signal.

16. The device as set forth in claim 12, further comprising:
   an output unit which drives a cell data output to the pad in the normal mode state and outputs the determination data stored in the storage unit in the ODT test mode state.

17. The device as set forth in claim 16, wherein the output unit include:
   a drive controller which selects and outputs the determination data stored in the storage unit in the ODT test operation mode, and which selects and outputs the cell data in the normal mode;
   an output driver that drives an output of the drive controller; and
   an ODT driver which is enabled when the input data is Input to the pad to reflect the resistance value of the ODT device to the Input data, and which is disabled when the resistance value of the CDT device is output to the pad to remove the resistance value of the ODT device.

18. The device as set forth in claim 17, wherein the drive controller includes:
   an enable unit which provides an ODT output enable signal to output the determination data in the ODT test operation mode, and provides a normal enable signal to output the cell data In the normal mode;
   an output selector which selects one of the cell data and the determination data in response to an ODT test mode signal enabled in the ODT test operation mode; and
   a drive signal output unit which transfers a signal output from the output selector to the output driver in response to an output signal of the enable unit.

19. A semiconductor device comprising:
   a pad to which an on-die-termination (CDT) device is applied;
   a comparison voltage supply unit which provides a first voltage in a normal mode, and which provides a second voltage in a test mode for testing a resistance value of the ODT device as the comparison voltage;
   an input buffer that compares an input data of the pad with the comparison voltage provided from the comparison voltage supply unit; and
   a storage unit that stores the comparison results of the input buffer.

20. The semiconductor device as set forth in claim 19, wherein the comparison voltage supply unit supplies, as the second voltage, a voltage at a lower level than a target voltage level which is determined by the resistance value of the ODT device.

21. The semiconductor device as set forth in claim 19, wherein the comparison voltage supply unit includes:
   an internal voltage generator which provides the first voltage in the normal mode and which provides the second voltage in the test mode for testing the resistance value of the ODT device;
   a mode controller that provides an ODT test mode signal enabled in the test operation mode; and
   a voltage selector which selects one of the first voltage and the second voltage in response to the ODT test mode signal of the mode controller and which outputs the selected voltage to the input buffer.

22. The semiconductor device as set forth in claim 19, wherein the storage unit includes a D flip-flop that stores the comparison results of the input buffer in synchronization with a clock signal.

23. The semiconductor device as set forth in claim 19, further comprising:
   an output data selection unit which outputs the cell data In the normal mode and outputs the data stored in the storage unit in the test mode; and
   an output driver that outputs data provided from the output data selection unit.

24. The semiconductor device as set forth in claim 23, wherein the output data selection unit includes:
   an enable unit which provides an ODT output enable signal enabled in the test mode to the output driver, and which provides an enable signal enabled in the normal mode to the output driver;
   a mode controller that provides an ODT test mode signal enabled in the test mode; and
   a data selector which selects one of the cell data and the data stored in the storage unit In response to the ODT test mode signal of the mode controller and which outputs the selected data to the output driver.

25. A method for testing a resistance value of an on-die-termination (ODT) device, the method comprising:
   generating a comparison data by comparing a test data input to a pad with a reference voltage in an ODT test operation;
   storing the comparison data in synchronization with a clock signal; and
   outputting the comparison data to the pad by driving the comparison data when an output enable signal is enabled.

26. The semiconductor device as set forth in claim 25, wherein the reference voltage is set at a level lower than a target voltage level which is determined by the resistance value of the ODT device.

27. The semiconductor device as set forth in claim 25, further comprising:
   reflecting the resistance value of the ODT device to the test data enabled when the test data are input through the pad; and removing the resistance value of the ODT device when the comparison data are output through the pad.

28. The semiconductor device as set forth in claim 25, wherein outputting the comparison data to the pad by driving the comparison data comprises:
  enabling the output enable signal in response to an ODT output enable signal enabled in the ODT test operation;
  selecting the comparison data in response to an ODT test mode signal enabled in the ODT test operation;
  outputting a drive signal by inverting and by driving the comparison data when the output enable signal is enabled; and
  outputting the comparison data to the pad by driving the comparison data by using the drive signal.

* * * * *